United States Patent [19]
Liguori

[11] Patent Number: 6,059,836
[45] Date of Patent: May 9, 2000

[54] LOGIC CIRCUIT EMULATOR

[76] Inventor: Vincenzo Arturo Luca Liguori, 14 Daisy Street, North Balgowlah, NSW, 2093, Australia

[21] Appl. No.: 09/014,359

[22] Filed: Jan. 27, 1998

[30] Foreign Application Priority Data

Feb. 5, 1997 [AU] Australia .................................. PO4935

[51] Int. Cl.[7] ...................................................... G06F 9/455
[52] U.S. Cl. ............................................................... 703/23
[58] Field of Search .................................. 371/22.3, 22.1, 371/22.5, 22.6; 395/500.43, 500.44, 500.17, 500.49

[56] References Cited

U.S. PATENT DOCUMENTS

| | | | |
|---|---|---|---|
| 4,161,036 | 7/1979 | Morris et al. ........................... | 364/900 |
| 5,263,149 | 11/1993 | Winlow . | |
| 5,477,475 | 12/1995 | Sample et al. . | |
| 5,596,742 | 1/1997 | Agarwal et al. . | |
| 5,627,840 | 5/1997 | Hundertmark et al. ................. | 714/726 |

OTHER PUBLICATIONS

IEEE Joint Test Access Group 1449 Specification.

*Primary Examiner*—Kevin J. Teska
*Assistant Examiner*—Lonnie A. Knox
*Attorney, Agent, or Firm*—Davis and Bujold

[57] ABSTRACT

An apparatus for simulating a logic circuit is disclosed comprising a first plurality of logic block circuits for simulating portions of the logic circuit the logic block circuits having a predetermined number of inputs and outputs; at least one routing logic block for routing signals between the logic block circuits; each of the logic block circuits further including: a first series of output scan chain units for capturing and storing each of the signal outputs of a corresponding the logic block circuit; and a second series of input scan chain units for storing and inputting a signal to each of the logic block inputs; each of the scan chain units being further interconnected to the routing logic block for the storing of the input signals and the output signals to and from the routing logic block. Further, the scan chain units can preferably comprise a series of serially interconnected storage units and the interconnection of the routing logic can preferably comprise a serial interconnection between one of the storage units and the routing logic. Ideally, the storage units comprise flip flops each interconnected to a master clock signal input. The output scan chain units can include a multiplexer connected between the signal outputs and a corresponding storage unit the multiplexer multiplexing the signal output and the output of an adjacent storage unit.

12 Claims, 8 Drawing Sheets

LOGIC CIRCUIT EMULATOR

TECHNICAL FIELD

The present invention relates to the field of hardware emulation for digital circuits.

BACKGROUND OF THE INVENTION

With the continuous increase in the number of components that are designed into digital systems, there has also been a growing demand for practical means of verifying the design implemented. Historically, software simulation has been an invaluable aid in the verification process that is part of circuit design. However, for complex circuits, software simulation is notoriously slow and, even though the speed of computers has steadily increased, so has the complexity of the circuits being simulated. A solution to this problem is provided by hardware emulators. These are complex reconfigurable circuits that can emulate a variety of digital systems. They offer a very substantial speed increase over software only simulators.

A possible way of building such hardware emulators is to use programmable logic devices such as FPGAs (Field Programmable Gate Arrays). FPGAs are ideal as hardware emulators but, in order to make their use practical for large designs, a few problems need to be addressed.

In fact, if the design to be emulated is too large, it won't fit in a single FPGA. Consequently, the design will need to be split across multiple chips. Some FPGA vendors even provide design partition software with their tool suite (i.e., Altera Corporation). Once a complex circuit has been split over multiple FPGAs, a board can be easily built and the circuit emulated.

Unfortunately, this procedure presents a major drawback. In fact, during the verification process, design faults are very likely to be found, leading to modifications of the emulation board. Such modification will be very often necessary due to a variety of reasons, including the non-deterministic nature of the partition software for FPGAs. This would in turn be, in the great majority of the cases, too expensive and slow, especially in the beginning, when the number of faults discovered is likely to be fairly high. Clearly, what is needed is a board where the connections among the FPGAs are completely reconfigurable.

U.S. Pat. No. 5,447,475 by P. Sample et al., describes a digital emulator comprising an array of FPGAs provided with a richly interconnected architecture. Those skilled in the art will easily appreciate the high complexity and cost involved in building and programming effectively such a device. In fact, the large number of potentially high speed interconnections on the printed circuit board make it very expensive and difficult to manufacture and design. Also, the large number of variables and constraints involved in the partitioning and placement of large designs onto the array of FPGAs leads to very complex and slow software. This has the direct effect of slowing the turnaround time during the debugging process while requiring especially fast workstations.

Another approach is disclosed in U.S. Pat. No. 5,263,149 from T. Winlow (Winlow). Here a plurality of Programmable Logic Devices (PLDs) are connected via a shared data bus and programmable interconnect logic blocks (PILBs).

Unfortunately, this disclosure presents a series of fundamental problems in its practical implementation as well as being severely limited in the type of design that it can emulate. In fact, as it is stressed in the description and the claims of Winlow, only logic blocks with latched outputs can be simulated. As it can be readily acknowledged by those ordinarily skilled in the art, this is serious disadvantage. Not only components with purely combination outputs cannot be included in the emulation, but many latched blocks that don't fit in a single PLD must be excluded as well. This happens when a logic block cannot be split across multiple PLDs in a way that only presents latched outputs.

Further, the interconnection system described in Winlow presents practical problems. In fact, if we consider the circuit to be emulated divided in large blocks, then a relatively large number of I/O pins per block are likely to be necessary. This in turn implies a large bus and, more importantly, PILBs capable of selecting signals from a large set and transferring them to a multitude of input pins of the corresponding PLD. This last requirement is likely to make the PILBs complex and possibly slow. On the other hand, if the circuit is split into a large number of small blocks, each with a small number of outputs, then the practical problem of multiplexing many signals onto the shared data bus is self-evident.

SUMMARY OF THE INVENTION

It is the objective of this invention to provide an alternative system which aids in the development of digital circuits and ameliorates the aforementioned disadvantages of the prior art. Accordingly, several advantages of the present invention are:

- high performance, FPGA based digital emulation through an extremely simple architecture;
- guaranteed and inexpensive interconnectability among the programmable elements;
- substantially simplified and accelerated programming procedure;
- these of standard off the shelf components, although higher performances is possible with specially designed parts;
- possibility to include in the emulation standard components directly when no model is available;
- full observability of any net inside or connecting the FPGAs;
- full controllability of the logic status of any FPGA.

In accordance with a first aspect of the present invention, there is provided an apparatus for simulating a logic circuit comprising: a first plurality of logic block circuits for simulating portions of the logic circuit, the logic block circuits having a predetermined number of inputs and outputs; at least one routing logic block for routing signals between the logic block circuits; each of the logic block circuits further including: a first series of output scan chain units for capturing and storing each of the signal outputs of a corresponding logic block circuit; and a second series of input scan chain units for storing and inputting a signal to each of the logic block inputs; each of the scan chain units being further interconnected to the routing logic block for the storing of the input signals and the output signals to and from the routing logic block.

Further, the scan chain units can preferably comprise a series of serially interconnected storage units and the interconnection to the routing logic can preferably comprise a serial interconnection between one of the storage units and the routing logic. Ideally, the storage units comprise flip flops each interconnected to a master clock signal input.

The output scan chain units can include a multiplexer connected between the signal outputs and a corresponding storage unit, the multiplexer multiplexing the signal output and the output of an adjacent storage unit. Further, the routing block can include a routing block storage means for storing the outputs from the output scan chain units; and an address permutation unit for permuting the addresses at which the signals are output from the routing block storage means so as to transfer the output signal from a first predetermined portion of the logic block circuits to the input signal of a second predetermined portion of the logic block circuits. Preferably, the routing block stores the outputs of each of the first series of output scan chain units in parallel. The apparatus can further include a control unit including clocking output signals for controlling the scan chain units and the routing logic block.

The apparatus is suitable for use with logic block circuits including Field Programmable Gate Arrays (FPGAs), Random Access Memory (RAM) or Central Processing Unit (CPUs) etc. If necessary the scan chain units can be constructed from Built in Self Test (BIST) circuitry.

DETAILED DESCRIPTION OF THE PREFERRED EMBODIMENT

Figure 1:
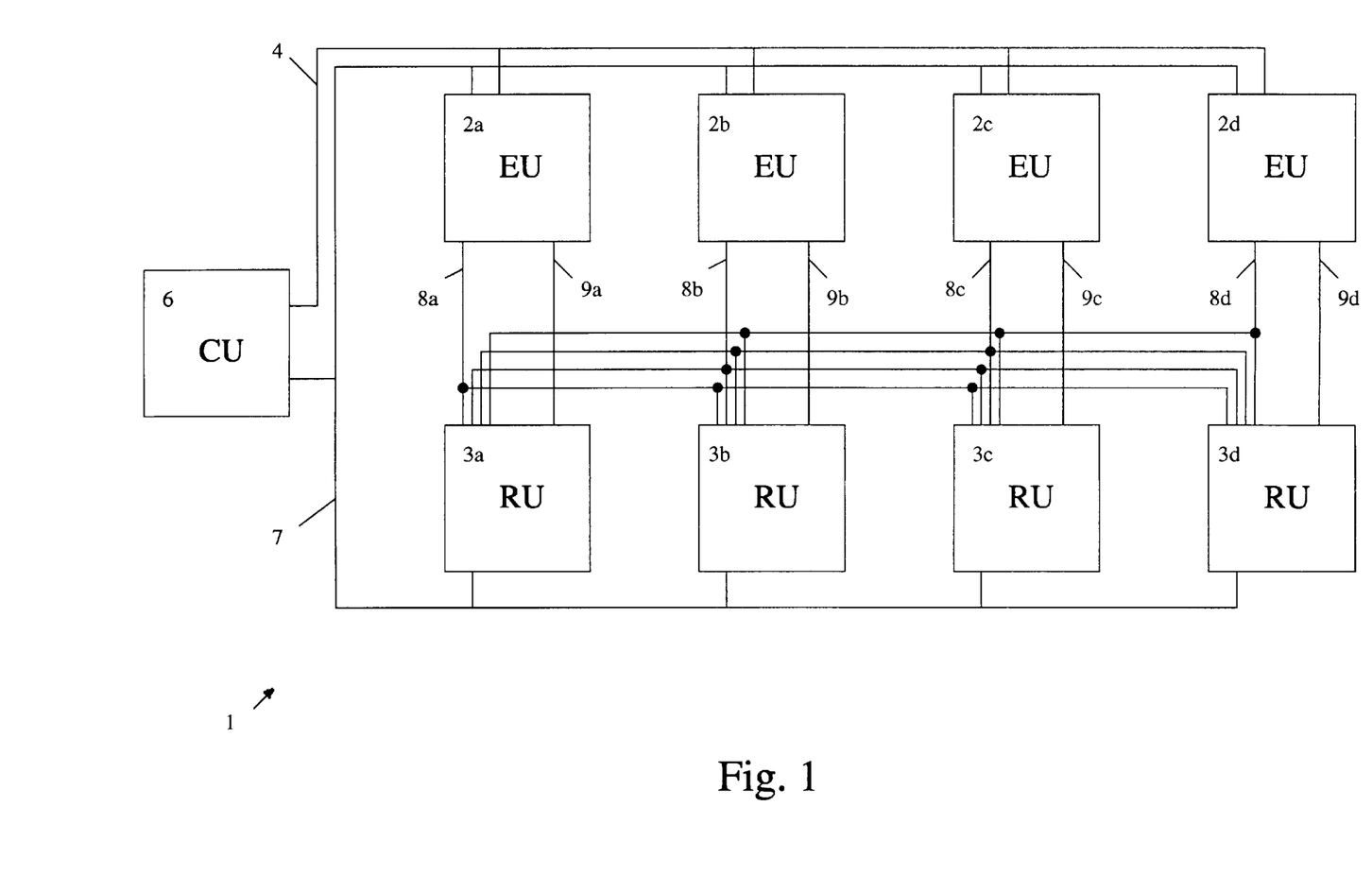
FIG. 1 is a schematic illustration of a logic emulator comprising four emulation units along with four routing units.

FIG. 1 shows a schematic illustration of the overall structure of the preferred embodiment of the invention. Emulation apparatus 1 includes a plurality of emulation units 2 (EUs) and associated routing units 3 (RUs). The EUs 2 are clocked by a plurality of clock signals 4 that are part of the design to be emulated (system clock). Both the EUs 2 and the RUs 3 are controlled via the control bus 7. The control unit 6 (CU), connected both to the EUs and the RUs, orchestrates the whole emulation process via the clocks 4 as well as the control bus 7. Each EU outputs signals to all the RUs through the bus 8 while receiving data from its associated RU through the bus 9. Those ordinarily skilled in the art will readily reconngize that the emulator comprising four EUs in FIG. 1 is for illustration purposes only and that, in the actual embodiment, the number of EUs is limited only be design choice.

Figure 2:
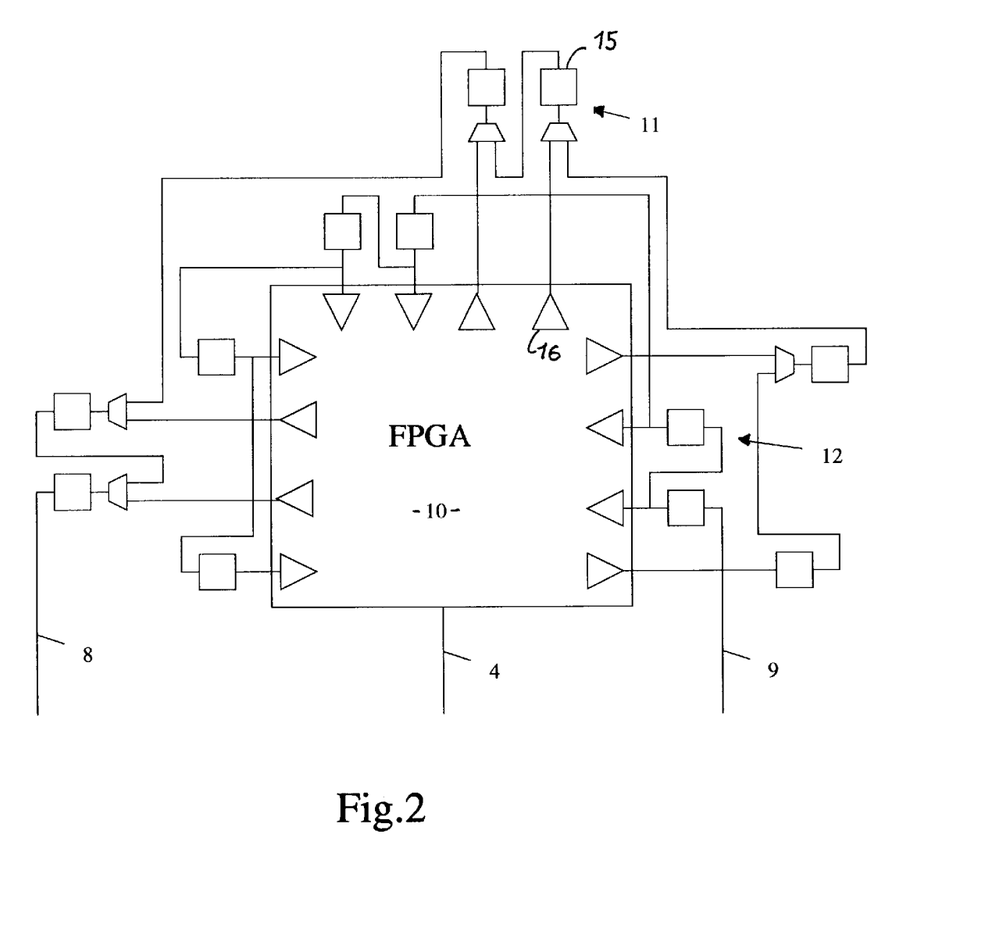
FIG. 2 is a schematic illustration of an emulation unit in detail, comprising an FPGA and an input and output scan chain of flip-flops.
Figure 2A:
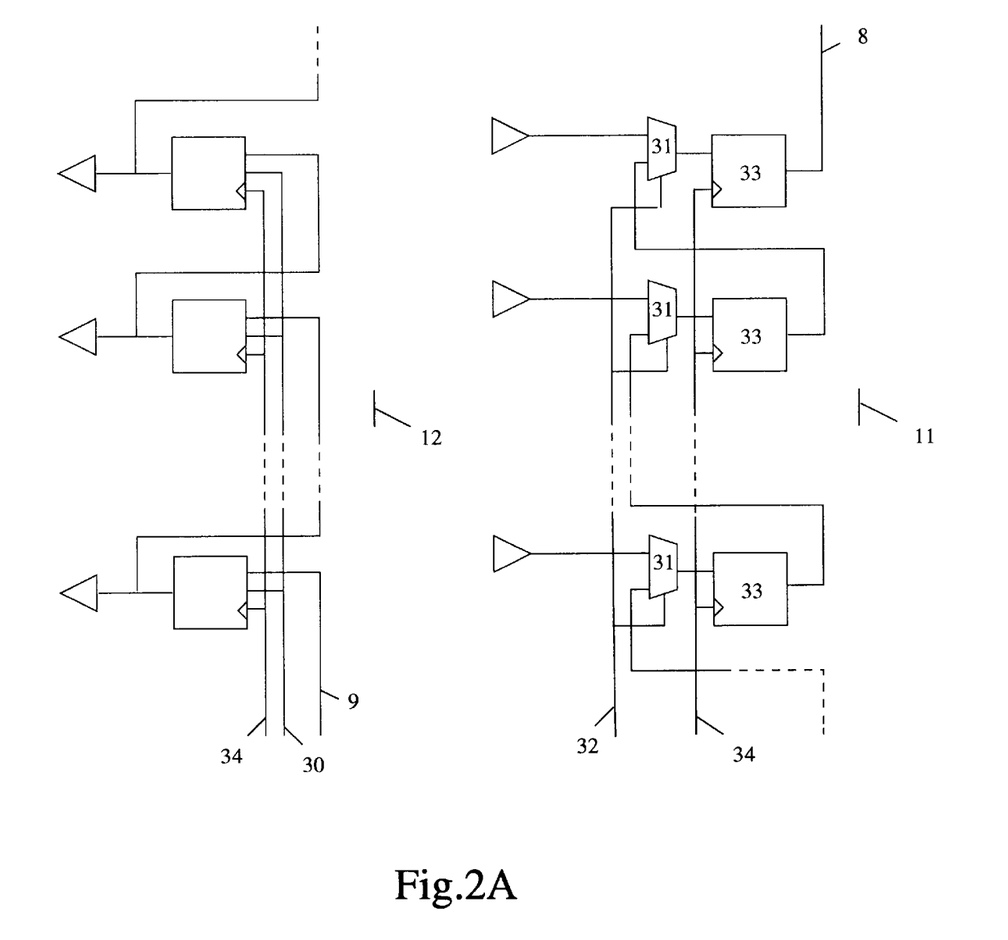
FIG. 2A is a schematic illustration of the details of the input and output scan chains.

FIG. 2 is a schematic illustration of the structure of an EU which comprises an FPGA 10 together with a scan chain 11 of flip-flops e.g.15, is connected to the output pins (output chain) and a scan chain e.g., 12 of flip-flops connected to the input pins (input chain). The input scan chain 12 receives its input from the bus 9, while the output chain 11 is connected to bus 8. As detailed in FIG. 2A which shows the relevant portions of the chain arrangement in more detail, both the chains are clocked by a routing clock 34, which forms part of the control bus 7 of FIG. 1. The input chain 12 is enabled via a signal 30 from the CU 6. Likewise the CU controls the output chain 11 via the multiplexers 31 and their selection signal 32. By acting on the selection signal 32, the CU can either sample the output pins of the FPGA 10 with the flip-flops 33 or enable the scan chain. The enable and sampling signals 30 and 32 are part of the control bus 7. Both the input and output chains need to be constructed according to the location of the input and output pins of the component to be emulated and can be implemented with simple and fast programmable logic.

Figure 3:
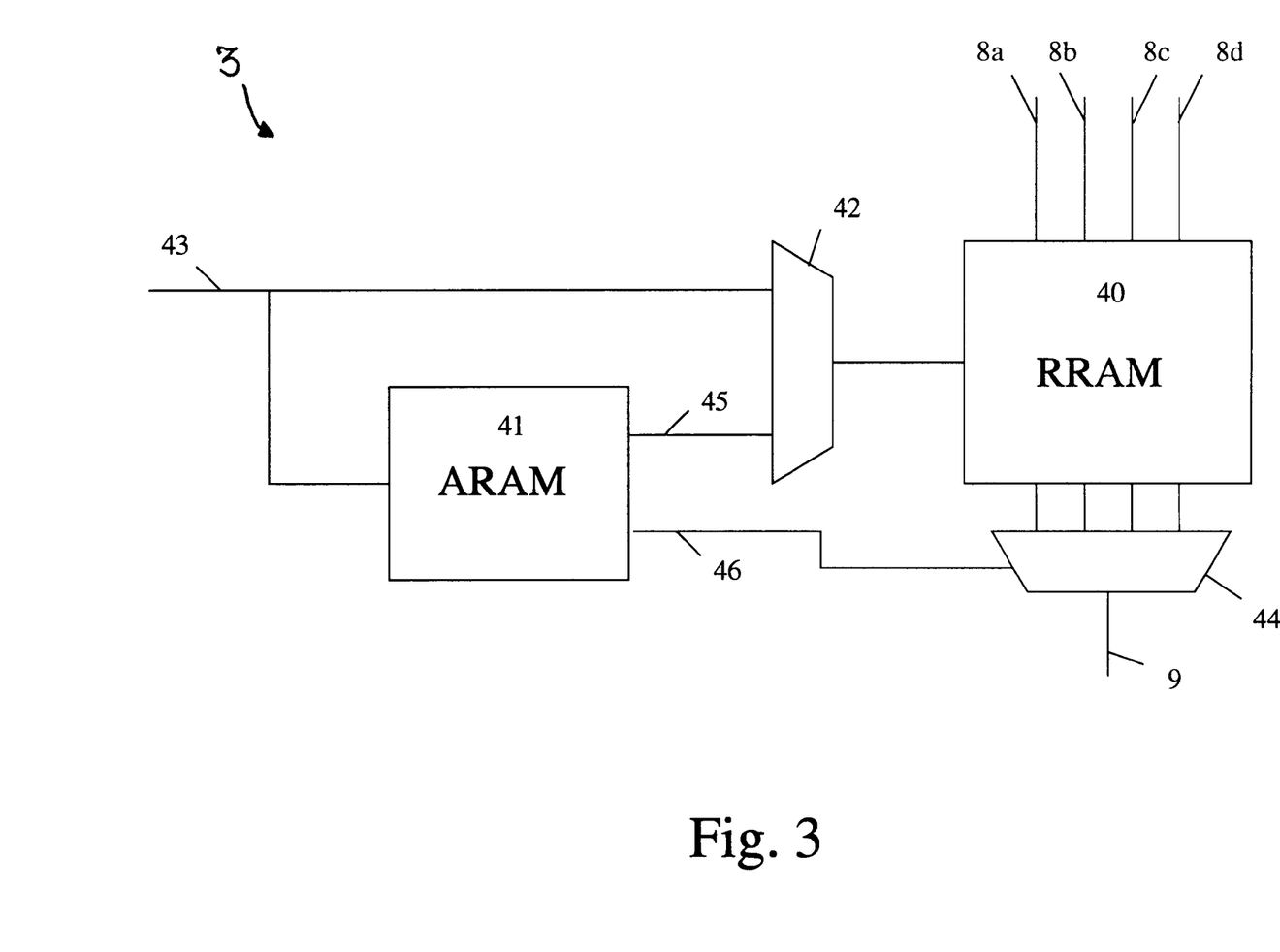
FIG. 3. is a schematic illustration of a routing unit.

FIG. 3 is a schematic illustration showing the RU 3 of FIG. 1 in more detail. The RU is capable of writing incoming signals 8 from all the output scan chains sequentially into the routing Ram 40 (RRAM). Any signal can then be read back in any desired order determined by an Address RAM 41 (ARAM).

During the emulation process the CU takes care of transferring the signals from the output pins to a storage medium and then to the input pins of the FPGAs. Once the transfer is completed and all the inputs are stable, the sys clock 4 is toggled. After the outputs are stable, the process is repeated.

As those ordinarily skilled in the art will have undoubtedly realised, it is very important for this transfer and storage of information to happen in the most efficient and practical way. This is achieved in the disclosed invention by controlling the input and output scan chains 12 and 11 as well as the RUs 3.

As soon as all the outputs of the FPGAs 10 are stable, the CU samples them using the flip-flops 33 in the output scan chain through the multiplexers 31. Then, by toggling the routing clock 34, the values sampled are transferred towards the RUs through bus 8. Each RU receives simultaneously the values coming from all the output chains and stores them in successive locations in the RRAM. This is achieved by the CU providing sequential addresses on the bus 43 of FIG. 3 connected through the multiplexer 42, controlled by the CU, to the address port of the RRAM. The bus 43 can form part of the control bus 7.

Once all the output values have been stored in the RRAM, they can be routed to the input pins of the FPGAs 10 via the bus 9. During this new phase the values previously stored sequentially in the RRAM are now read out of order. Again the CU provides sequential addresses on bus 43, but now the address port of the RRAM is connected to the output 45 of the ARAM, through the multiplexer 42. The output 46 of the ARAM also controls the output to the bus 9 through the multiplexer 44. By carefully programming the ARAM, this arrangement allows the reading of any bit from any word of the RRAM (any bit in the RRAM can be specified by a pair (h,k) in the ARAM which indicates the $k_{th}$ bit in the $h_{th}$ location). The values retrieved in this fashion are then directed to the appropriate input pins of the FPGA using the bus 9 and the input scan chain 12.

The topology of the output scan chain 11 defines the order in which the output values are stored in the RRAM during the writing phase. Similarly, the topology of the input scan chain 12, as well as the one of the required interconnections among the FPGAs, define together the order in which the values need to be read from the RRAM. Given that the location within the RRAM of any output value is known, the ARAM can be programmed so that the RRAM is read in the correct order. Thus, to route the output value of pin z from FPGA N to the input pin j of FPGA M, we need to write in the $j_{th}$ location of the RRAM belonging to the RU M the pair (z, N). The numbering convention of the pins is defined by their topology, as previously discussed. It is also worth noticing that the address provided by the CU on the bus 43 don't even need to be sequential. This observation can be useful since non-sequential counters are often faster and simpler to implement.

As it can be easily appreciated, the transfer rate through the scan chains depends on their length and the speed of the routing clock 34. However, given their extreme simplicity, they can achieve high speed using standard programmable logic.

Those ordinarily skilled in the art will have noticed that components other than FPGAs could be inserted in the EUs thus allowing standard parts such as RAMs, CPUs, etc. to be part of complex simulations.

Figure 4:
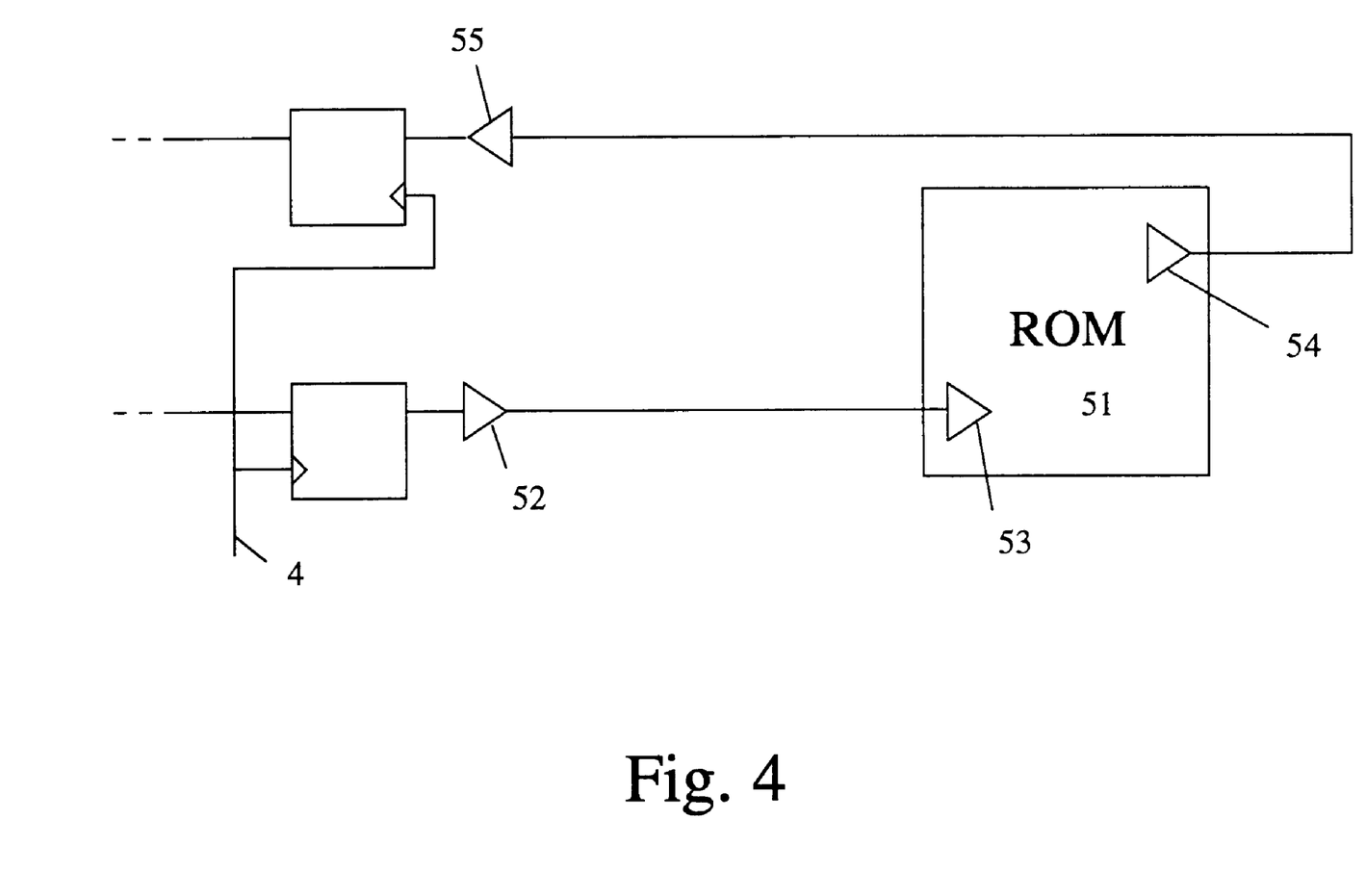
FIG. 4 is a schematic illustration of a component with a purely combinational path.

Finally, it is important for the transfer of the output pin values to happen after any circumstance that might require its propagation to the rest of the circuit (i.e. consider a circuit active on both edges of the sys clock or with multiple clocks). Purely combinational paths might require two or more transfers before toggling the sys clock. For example, considering the situation illustrated in FIG. 4, where the ROM 51, included in the emulation as a separate component, is read in the sys clock cycle. One transfer is needed to bring the value from port 52 to port 53 and a second one to transfer the value from port 54 to port 55, before sys clock is toggled. Clearly, the presence of purely combinational paths, by potentially requiring more transfers between clocks, might slow down the emulation process.

Figure 5:
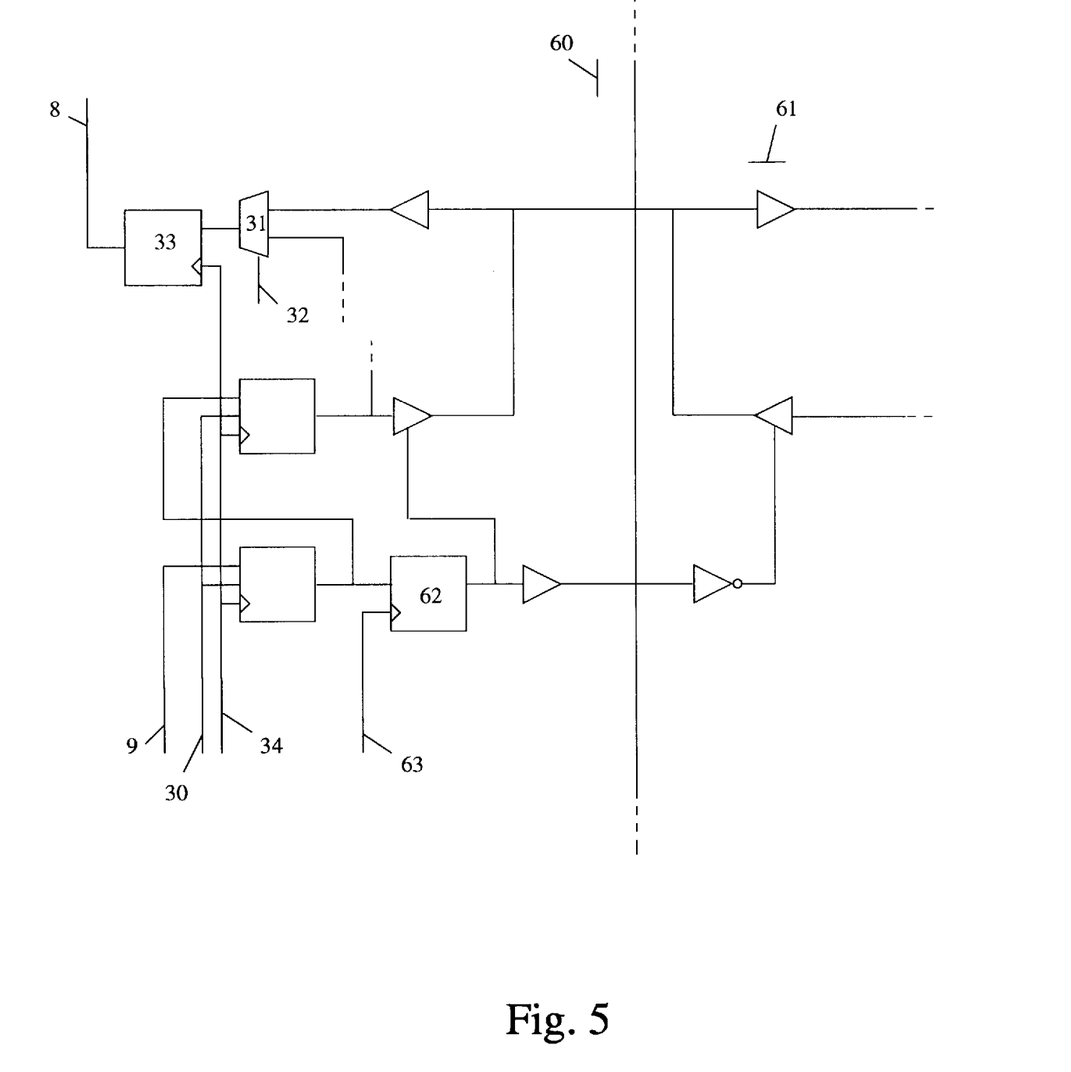
FIG. 5 is a schematic illustration of an example of modification of the input and output scan chain in the presence of tri-state buses.

Special attention is also required for tri-state buses. The latter can be considered as a particular type of combinational circuit and can be effectively emulated with multiplexer type of circuitry. However, when a component like a standard SRAM is part of the circuit to be emulated, its tri-state buses can't be emulated with multiplexers as no access to the internal I/O buses of the SRAM are normally provided. In such cases special modifications of the output scan chain of the EUs are necessary to avoid bus conflicts or spurious pulses when the data is pushed through the chain. An example of such modification is shown in FIG. 5. Here a tri-state pin 61 of a component 60 is connected to modified input and output scan chains. In order to prevent bus conflicts while the values are pushed along the input scan chain, the latch 62 is provided. The latter is enabled via the signal 63 as soon as its input is stable. A similar protection mechanism must be also provided whenever the scan chain drives edge sensitive circuits, in order to avoid spurious pulses.

The simple interconnection system described can provide high performance in emulation even when using ordinary, off the shelf components. Furthermore, the guaranteed interconnectability greatly simplifies the software that partitions a large design to be emulated into multiple FPGAs. Unlike the case of the prior art, the interconnections among the FPGAs don't' need to be accommodated in a fixed structure and can always be routed. In fact, in the aforementioned prior art, a connection among two FPGAs might need to pass through a number of other FPGAs, reducing valuable pin resources. This problem doesn't exist for the present embodiment. This reduction in complexity greatly improves the performance of the algorithms required to split a given design onto a multiple FPGAs. The reduction in complexity is even more evident in the case of standard parts (such as RAMs, CPUs etc.) to be included in the emulation. In the prior art these need to be in specific locations, placing strong constraints on the position of the connections and the logic that drives them. In the case of the present invention, such parts can be placed in any EU since the connections among the EUs are guaranteed to be routed with no extra cost. Furthermore, the small number of physical interconnections required by this logic emulator translates directly into a greatly simplified printed circuit board.

Once the design has been split into multiple FPGAs, it can be placed and routed within each FPGA using standard software. As already mentioned, some FPGA vendors (such as Altera Corporation) even provide software that will split large designs onto multiple FPGAs, therefore allowing utilization of this invention directly.

The logic emulator described will also allow easy observation of any net and full control of its logic status. In fact, external connections among the FPGAs can be easily observed and modified by accessing the RRAM directly between the two routing phases. This also allows signals to be inputted from and outputted to the emulator. It is also possible to insert a scan chain in all the flip-flops composing the design thus permitting full observability and control of the logic status of the circuit being emulated.

In accordance with alternative embodiments it is possible, in order to simplify the design of the emulator, to utilize the input and output scan chains that are part of the standard JTAG interface that is already available in many existing FPGAs and other standard parts. However, since the speed of the emulation depends heavily on the speed of input and output chains and since these are normally slow in JTAG circuits, this is not generally advisable.

Figure 6:
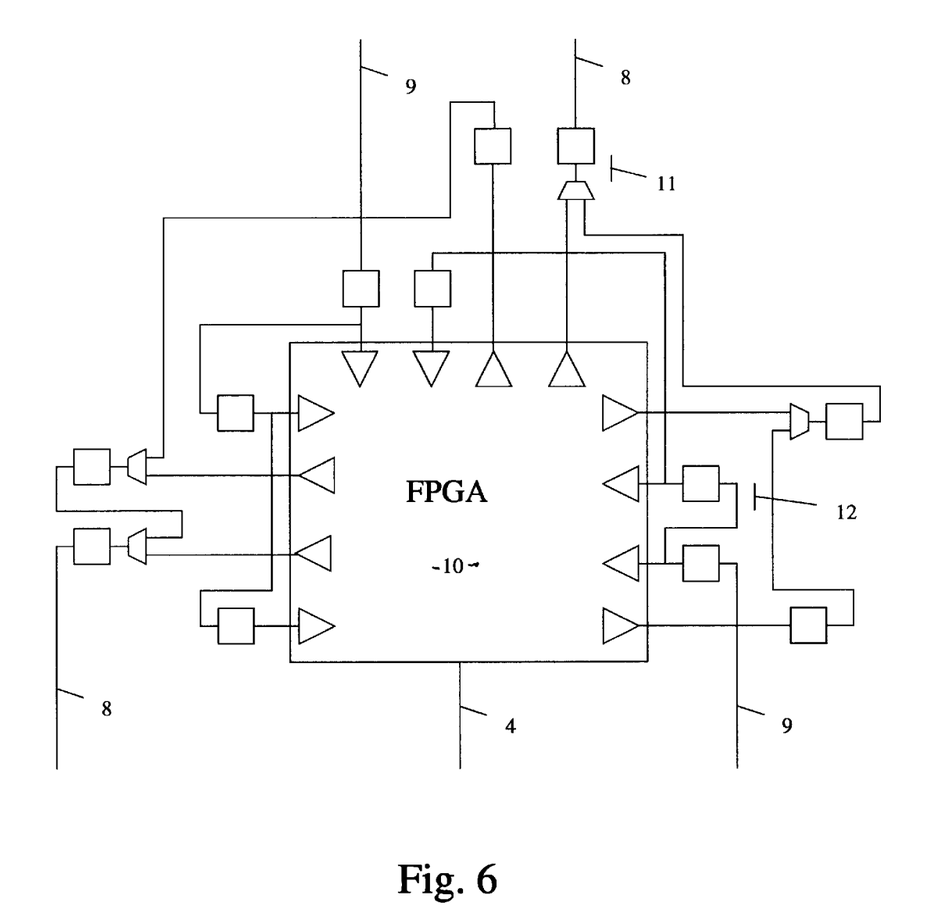
FIG. 6 is a schematic illustration of an example of multiple input and output scan chains.
Figure 7:
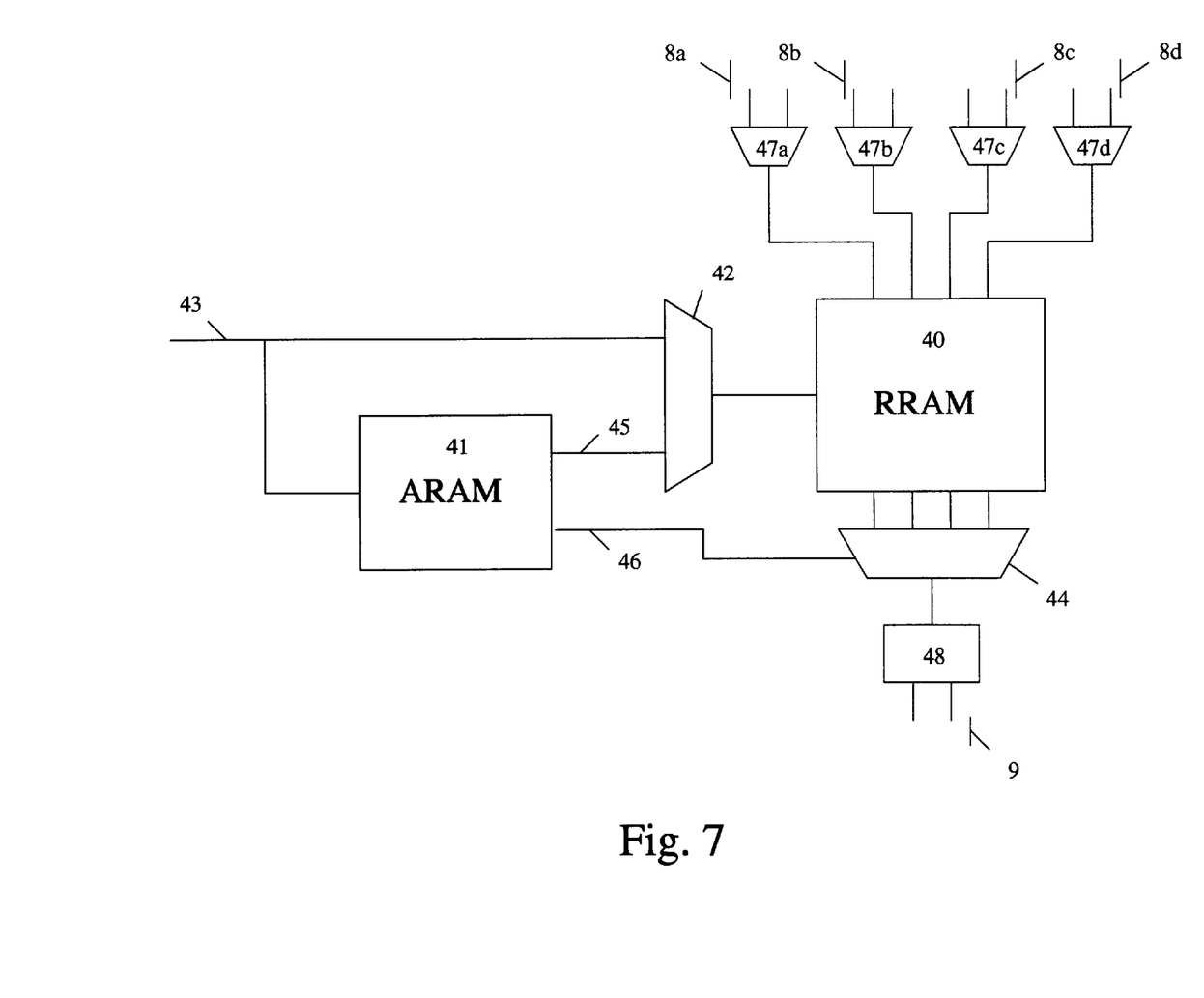
FIG. 7 is a schematic illustration of an example of a modified routing unit.

In order to increase the performance of the emulator it is possible to use multiple shorter input scan chains for each EU, instead of a single long one. This will have the effect of reducing the transfer time of the data through them, thus increasing the bandwidth. A similar technique can be applied to the output chain. FIG. 6 shows an example of an alternative embodiment having multiple input and output scan chains. The length of both the scan chains is halved while the width the input and output buses 9 and 8 is doubled. This is equivalent to doubling the number of EUs and, consequently, the number of RUs and the width of their inputs will double. Thus the greater bandwidth is traded off with an increased circuit complexity. Some of the resulting complexity can be effectively reduced by implementing the RUs as Application Specific Integrated Circuits (ASICs). In fact, small RAMs such as the one required by the RUs can attain speed increases of up to an order of magnitude in an ASIC when compared to off the shelf parts. Since the speed of the scan chains cannot be easily increased, this larger bandwidth can be exploited by multiplexing into and demultiplexing out of the faster RRAM larger buses 8 and 9. An example of a modified RU design is illustrated in FIG. 7. Here the incoming buses 8 are multiplexed through the muxes 47 while the output is demultiplexed by the demultiplexer 48 to form the bus 9.

It can be seen that the preferred embodiment provides a user with a simple, programmable logic emulator, which has numerous advantages over the prior art. These advantages include:

simplicity in manufacturing with a low complexity and inexpensive printed circuit board;

guaranteed interconnectability among the programmable elements;

great simplification of the partition and programming software as a consequence of such guaranteed interconnectability;

no special components required to build a high performance machine, although improvements are possible with custom parts;

possibility to include in the emulation standard components directly when no model is available;

full observability of any net inside or connecting the FPGAs;

full controllability of the logic status of any FPGA.

Although the description of the preferred embodiment above contains many specificities, these should not be constructed as limiting the scope of the invention but as merely providing illustration of some of the presently preferred embodiments of this invention. For example, the type of routing system that transfers output pins values to a storage media and then to the input pins can be substantially different from the one described since many methods of transferring signals are well known in the prior art and extensively used by the telecommunication industry.

Thus the scope of the invention should be determined by the appended claims and their legal equivalents, rather than by the examples given.

I claim:

1. An apparatus for simulating a logic circuit according to simulated clock cycles initiated by clock signals, said apparatus comprising:

a first plurality of logic block circuits for simulating portions of said logic circuit upon receipt of a clock signal for a simulated clock cycle, said logic block circuits further having a predetermined number of signal inputs and outputs;

at least one routing block for routing signals between said logic block circuits between said simulated clock cycles; and each of said logic block circuits further including:

a first series of output scan chain units for capturing and storing each of the signal outputs of a corresponding said logic block circuit at an end of said simulated clock cycle; and a second series of input scan chain units for storing and inputting a signal for each of said logic block units at a beginning of said simulated clock cycle;

each of said scan chain units being further interconnected to said routing logic block for storing of said input signals and said output signals to and from said routing; logic block between said simulated clock cycles.

2. An apparatus as claimed in claim 1 wherein said scan chain units comprise a series of serially interconnected storage units.

3. An apparatus as claimed in claim 2 wherein said interconnection to said routing logic comprises a serial interconnection between one of said storage units and said routing logic.

4. An apparatus as claimed in claim 2 wherein said storage units comprise flip flops each interconnected to a master clock signal input.

5. An apparatus as claimed in claim 2 wherein said output scan chain units include a multiplexer connected between said signal outputs and a corresponding said storage unit said multiplexer multiplexing said signal output and the output of an adjacent storage unit.

6. An apparatus as claimed in claim 1 wherein said routing block comprises routing block storage means for storing the outputs from said output scan chain units;

address permutation unit for permuting the addresses at which said signals are output from said routing block storage means so as to transfer the output signals from a first predetermined portion of said logic block circuits to the input signal of a second predetermined portion of said logic block circuits.

7. An apparatus as claimed in claim 6 wherein said routing block stores the outputs of each of said first series of output scan chain units in parallel.

8. An apparatus as claimed in claim 1 further comprising:

a control unit including clocking output signals for controlling said scan chain units and said routing logic block.

9. An apparatus as claimed in claim 1 wherein said logic block circuits include one of Field Programmable Gate Arrays (FPGAs), Random Access Memory (RAM) or a Central Processing Unit (CPU) or other digital component sub-block.

10. An apparatus as claimed in claim 1 wherein said scan chain units are constructed from Built in Self Test (BIST) circuitry.

11. A configurable digital system for simulating a logic circuit according to simulated clock cycles initiated by clock signals, said system comprising:

a plurality of digital components each having a predetermined number of input and output pins for performing algorithmic functions on signal inputs upon receipt of a clock signal for a simulated clock cycle;

a plurality of sample storage devices to sample a value of said output pins at the end of said simulated clock cycle; and a routing system to store and transfer, in a time multiplexed fashion, the values sampled by said sample storage devices for forwarding to a predetermined input pin before a beginning of a next said simulated clock cycle;

whereby over many simulated clock cycles the emulation of the operation of said logic circuit is achieved.

12. A method of emulating a logic circuit according to simulated clock cycles initiated by clock signals, the method comprising the steps of:

(a) dividing said logic circuits into a series of logic blocks each having predetermined inputs and outputs;

(b) simulating the operation of each of said series of logic blocks during a first simulated clock cycle;

(c) storing the said outputs of each of said series of logic blocks at an end of said first simulated clock cycle;

(d) distributing said outputs to predetermined ones of said inputs to said series of logic blocks before a start of a subsequent simulated clock cycle; and (e) iteratively repeating said steps (b) to (d) so as to emulate the operation of said logic circuit.

* * * * *